(12) United States Patent
Chien

(10) Patent No.: US 7,042,302 B2
(45) Date of Patent: May 9, 2006

(54) VCO WITH POWER SUPPLY REJECTION ENHANCEMENT CIRCUIT

(75) Inventor: Hung-Ming Chien, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 73 days.

(21) Appl. No.: 10/813,275

(22) Filed: Mar. 31, 2004

(65) Prior Publication Data

US 2005/0225398 A1 Oct. 13, 2005

(51) Int. Cl.
*H03B 1/04* (2006.01)
*H03L 5/00* (2006.01)

(52) U.S. Cl. .................................... 331/185
(58) Field of Classification Search ............. 331/107 R, 331/109, 154, 175, 182, 185, 186
See application file for complete search history.

(56) References Cited

U.S. PATENT DOCUMENTS

| | | | | |
|---|---|---|---|---|
| 5,408,174 A | * | 4/1995 | Leonowich | 323/315 |
| 5,909,150 A | * | 6/1999 | Kostelnik et al. | 331/34 |
| 6,166,670 A | * | 12/2000 | O'Shaughnessy | 341/136 |
| 6,545,540 B1 | * | 4/2003 | Enriquez | 330/288 |
| 6,803,829 B1 | * | 10/2004 | Duncan et al. | 331/34 |
| 2004/0017268 A1 | | 1/2004 | Rogers | |

FOREIGN PATENT DOCUMENTS

| | | |
|---|---|---|
| JP | 59027611 | 2/1984 |
| JP | 2003158431 | 5/2003 |

\* cited by examiner

*Primary Examiner*—David Mis
(74) *Attorney, Agent, or Firm*—Squire, Sanders & Dempsey LLP

(57) ABSTRACT

An oscillating circuit having a noise reduction circuit is disclosed. The noise reduction circuit is coupled to the current source for the oscillating circuit. The noise reduction circuit reduces a bias noise component from a bias current, and a supply noise component from a supply current. The noise reduction circuit is coupled to the current source at a gate and a supply for the current source. The noise reduction circuit includes a filter coupled to the gate of the current source that reduces the bias noise component. The noise reduction circuit also includes a degeneration circuit coupled to the supply of the current source that reduces the supply noise component. The current source generates an input signal to control the oscillating circuit with reduced noise.

38 Claims, 3 Drawing Sheets

VCO WITH POWER SUPPLY REJECTION ENHANCEMENT CIRCUIT

BACKGROUND OF THE INVENTION

1. Field of the Invention

The present invention relates to controlled oscillators, and more particularly, the present invention relates to a controlled oscillator that provides an output frequency controlling signal subject to a noise reduction circuit.

2. Description of the Related Art

The use of wireless communication applications for in-home, in-building networks and direct communications is increasing. These applications modulate data onto at least one carrier and transmit data as a modulated signal via a transmitter. A receiver receives the frequency modulated signal, and demodulates it to recapture the data.

In the various stages of transmitting and receiving signals, local oscillators generate signals that result in an output frequency. Sometimes the desired frequency may vary. Variable frequency oscillators are tunable oscillators that receive a fixed frequency that is output over a selectable wide range of frequencies. To oscillate, a resultant gain should be high, any feedback should be positive, and the coupling from the output to input should be effective. The oscillation frequency is controlled via the frequency tuned circuits. Oscillation should take place at a predictable and stable frequency, without the introduction of excessive noise or degradation of any signals.

The frequency for a variable frequency oscillator can be adjusted via a varactor. A varactor may include a semiconductor diode that works as a variable capacitor when it is reverse-biased. The capacitance of the varactor depends on the reverse-bias voltage. The greater the voltage, the lower the value of the capacitance. The varactor is placed in a parallel with the tuning capacitor, and is isolated for direct current by blocking capacitors. The resulting oscillator may be referred to as a voltage controlled oscillator. Frequency control using the varactor is preferable to the use of mechanically variable capacitors or inductors. Varactors tend to be less bulky and lower in cost.

A voltage controlled oscillator (VCO) circuit may operate at high frequencies, such as in the gigahertz range. Noise within circuits operating at high frequency can impede performance and degrade the control and output signals. For example, noise in the input signal may result in large variations of the resulting output signal. This action, in turn, degrades performance of any circuit, detector, carrier, transmitter device and the like using the VCO circuit. Noise within VCO circuits can come from many sources. Input noise may arrive at the VCO from a coupled power supply or other components, either in the current or voltage. In a fully integrated chip, the power supply, or the chip itself can be noisy.

Noise also arrives at the VCO circuit from the gate, or reference circuit. This noise may occur when the current source is also connected to a current mirror, or bandgap reference. For example, the current mirror is in parallel with the VCO circuit. The current mirror draws current from the current supply coupled to the VCO circuit. This cross connection produces noise that is then input into a gate coupled to the VCO circuit.

Thus, noise is a critical factor in VCO circuits, particularly those that operate at high frequencies. The noise may be amplified to affect output signals correlating to the input signals driving the VCO circuit. Further, supply and bias noise is introduced to the input signals to impede the input signals.

SUMMARY OF THE INVENTION

According to a preferred embodiment of the invention, a noise reduction circuit coupled to an oscillating circuit is disclosed. The noise reduction circuit includes a filter coupled to a gate of a current source for an oscillating circuit to filter a bias noise component into the gate. The noise reduction circuit also includes a degeneration circuit coupled a supply for the current source. The degradation circuit reduces a gain within the current source.

A system for reducing noise in an oscillating circuit also is disclosed. The system includes a filtering device having a first resistance and a capacitance to filter a bias current and coupled to a gate of a current source. The system also includes a degeneration device having a second resistance to reduce a noise component in a supply current at the current source.

A method for reducing noise in an oscillating circuit also is disclosed. The method includes filtering a bias noise component from a bias current flowing into a gate of a current source for an oscillating circuit. The method also includes reducing a supply noise component from a supply current flowing into a supply of the current source.

A method for reducing noise components also is disclosed. The method includes reducing a bias noise component by passing a bias current through a noise reduction circuit coupled to a gate of a current source to an oscillating circuit. The method also includes reducing a supply noise component by passing a supply current through the noise reduction circuit coupled to a supply of the current source.

A circuit also is disclosed. The circuit includes an oscillating circuit to generate an output signal. The circuit also includes a current source to control the oscillating circuit. The current source receives a signal derived from a reference signal to generate the output signal. The circuit also includes a noise reduction circuit coupled to a gate and a supply of the current source to reduce a noise component within the signal.

It is to be understood that both the foregoing general description and the following detailed description of the preferred embodiments are exemplary and explanatory, and are intended to provide further explanation of the invention as claimed.

BRIEF DESCRIPTION OF THE DRAWINGS

For proper understanding of the invention, reference should be made to the following description and the accompanying drawings, wherein.

DETAILED DESCRIPTION OF THE PREFERRED EMBODIMENTS

Reference will now be made to the disclosed embodiments of the present invention, examples of which are illustrated in the accompanying drawings.

Figure 1:
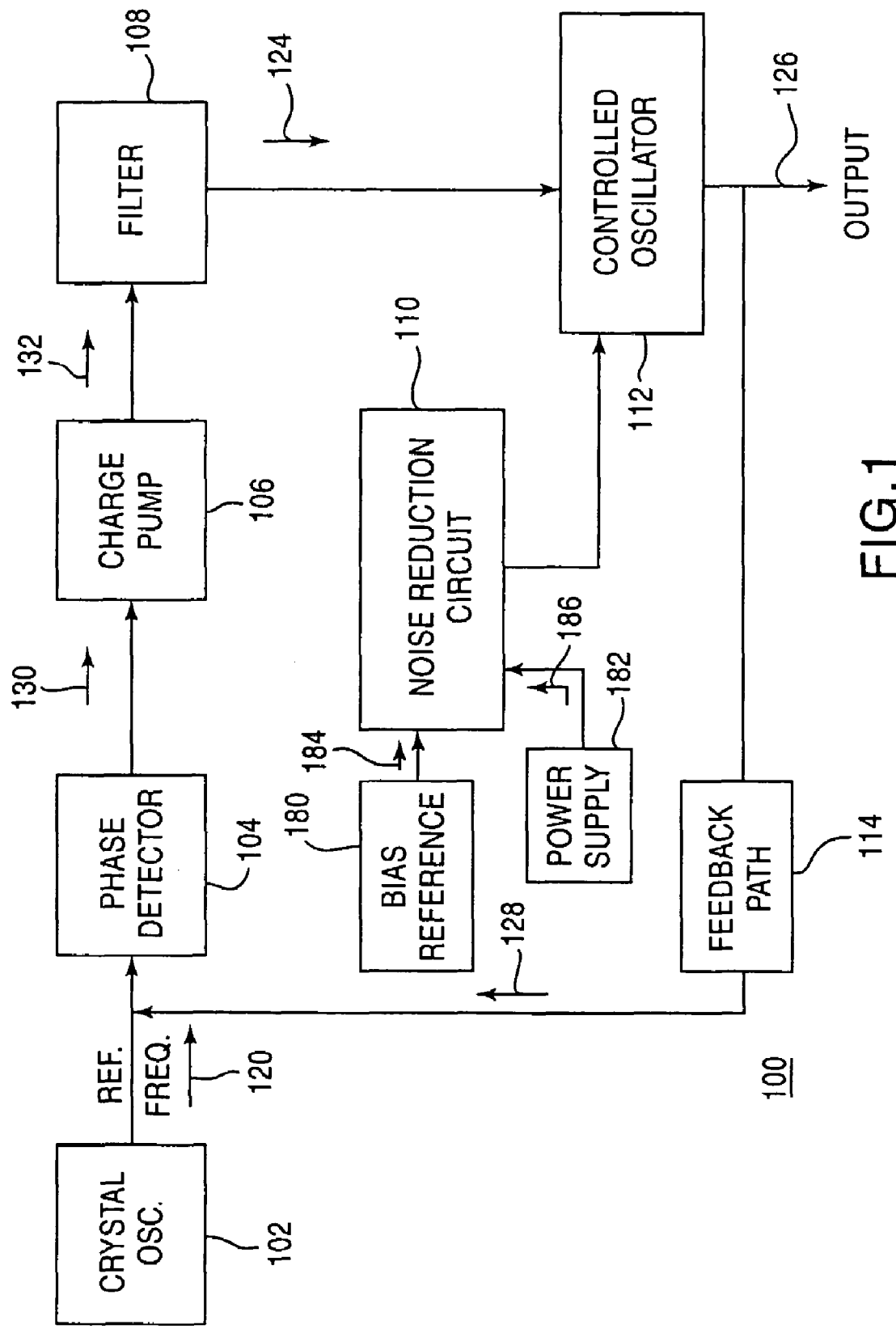
FIG. 1 illustrates a block diagram of an phase locked loop having a noise reduction circuit according to the preferred embodiments.

FIG. 1 depicts a block diagram of a phase locked loop (PLL) 100 having noise reduction circuit 110 according to the preferred embodiments. PLL 100 may be a circuit configured to provide an output signal 126. PLL 100 may be used in a variety of communication devices using one or more local oscillators. PLL 100 may be implemented in a conventional PLL or produce a local oscillation from a reference frequency.

In one example, PLL 100 includes crystal oscillator 102 that generates reference frequency signal 120. Reference frequency signal 120 is input into phase detector 104, along with feedback signal 128. Phase detector 104 may detect the difference between reference frequency signal 120 and feedback signal 128. A differential signal 130 is generated by phase detector 104 to indicate the difference between reference frequency signal 120 and feedback signal 128. Charge pump 106 can convert differential signal 130 into either a charged-up signal or a charged-down signal. For example, charge pump 106 may add an offset current to charge-up and output modified signal 132. Filter 108 filters modified signal 132 to produce a filtered, or input, signal 124. Filter 108 can be a low pass filter. Controlled oscillator 112 may receive input signal 124.

Bias signal 184 may be generated by bias reference 180. Power supply 182 may generate power supply signal 186. Both bias signal 184 and supply signal 186 can include noise components. For example, if bias signal 184 and supply signal 186 include currents flowing to noise reduction circuit 110, then the current within each signal includes noise that should be reduced or eliminated prior to being inputted to controlled oscillator 112. Noise reduction circuit 110 reduces the noise within signals 184 and 186 to input to controlled oscillator 112. Input signal 124 may control controlled oscillator 112 to generate output signal 126 having the desired frequency.

PLL 100 also includes feedback path 114 that carries feedback signal 128. In this example, feedback path 114 may be used to adjust the frequency of output signal 126 in accordance with reference frequency signal 120. Feedback path 114 may include a divider and associated components that receive output signal 126 and divide output signal 126 by an integer to generate feedback signal 128. Preferably, PLL 100 may adjust the frequency of output signal 126 until the desired frequency is achieved.

Controlled oscillator 112 can be a tunable oscillator that can adjust output signal 126 accordingly. Large noise components within input signal 124 can cause controlled oscillator 112 to repeatedly output at undesired frequencies. PLL 100 may have to adjust repeatedly until the desired frequency is achieved. Further, input signal 124 may be degraded by the amplification, or gain, provided to noise components in output signal 126. Noise reduction circuit 110 seeks to reduce noise components, therefore, preventing signal degradation and may decrease the gain of noise components input to controlled oscillator 112. The noise reduction circuit may include two components, a low pass filter, and a degradation circuit. These components are disclosed in greater detail below.

PLL 100 is disclosed according to one exemplary embodiment. PLL 100 also may include additional components or circuits. Further, PLL 100 may not include all the components disclosed with reference to FIG. 1. For example, PLL 100 may include only crystal oscillator 102, noise reduction circuit 110 and controlled oscillator 112.

Figure 2:
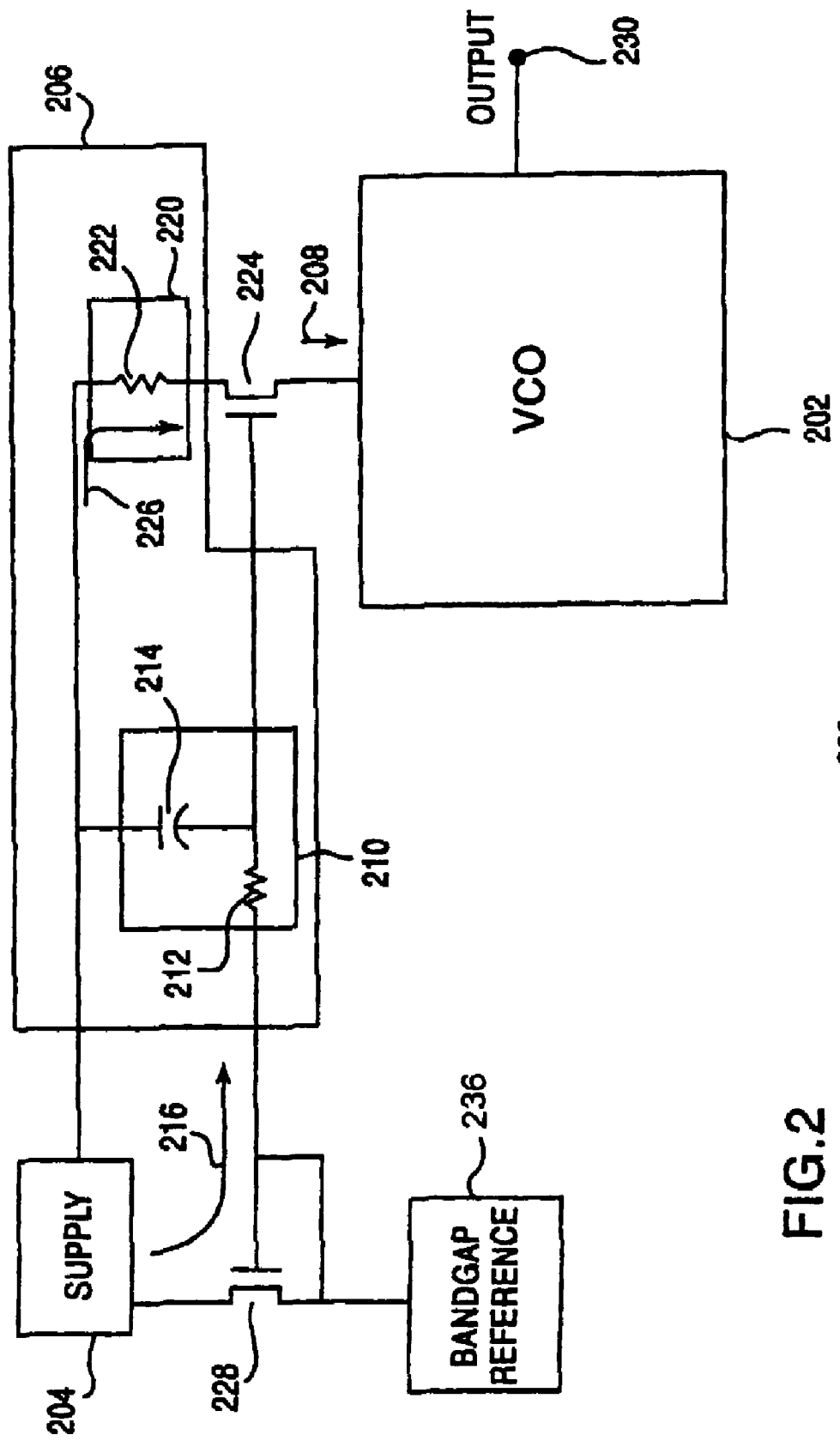
FIG. 2 illustrates a supply coupled to a VCO with a noise reduction circuit according to the preferred embodiments.

FIG. 2 depicts a circuit 200 having a voltage controlled oscillating circuit, or oscillator, 202 according to the preferred embodiments. Components of oscillator 200 may correlate to components of PLL 100, but the subsequent disclosure is not meant to limit the features disclosed with reference to FIG. 1.

Oscillator 202 may be any conventional voltage controlled oscillating circuit that receives an input to oscillate accordingly. Oscillator 202, can be, for example, a voltage controlled oscillator. Alternatively, oscillator 202 may be any controlled oscillating circuit, such as a current controlled circuit. Output signal 230 of oscillator 202 may be varied by a received input signal. Output signal 230 may have an output frequency that is a function of the controlling signal of oscillator 202. Oscillator 202 may operate at high frequencies. Preferably, oscillator 202 may operate in the gigahertz (GHz) range. Oscillator 202 can be coupled to supply 204.

Supply 204 supplies current to oscillator 202. Alternatively, supply 204 may include components that result in supplying a current to oscillator 202. Coupled between supply 204 and oscillator 202 may be noise reduction circuit 206. Noise reduction circuit 206 seeks to reduce, or eliminate, the amount of noise input to oscillator 202. Noise entering oscillator 202 may degrade the generation of output signal 130. Alternatively, other circuit elements may be coupled between supply 204 and oscillator 202 besides noise reduction circuit 206. Preferably, however, noise reduction circuit 206 can be coupled to the input of oscillator 202.

Supply 204 also may be connected to other circuit elements, such as element 228. Element 228 may be a gate or diode coupled to a bandgap reference 236. Bandgap reference circuit 236 may draw current from supply 204, in addition to oscillator 202. Current 216 may be referred to as a bias current. Element 228 and bandgap reference circuit 236 may act as a current mirror used in an integrated circuit for biasing. Bias current 216 can be generated by drawing some of the supply current from supply 204 to element 228 to oscillator 202.

Bias current 216 may include a noise component that also flows to oscillator 202. Noise reduction circuit 206 may reduce the bias noise component in bias current 216 before it enters oscillator 202.

Supply 204 also generates supply current 226 to be input to oscillator 202. Noise reduction circuit 206 also may reduce the noise component of supply current 226. In addition, noise reduction circuit 206 may provide an increased impedance into the input of oscillator 202.

Current source 224 can be coupled to the input of oscillator 202. Current source 224 also is coupled to noise reduction circuit 206. Current source 224 also may be known as a varactor. Preferably, current source 224 acts as a common source amplifier. Further, current source 224 may comprise a first semiconductor material. For example, current source 224 may comprise a p-channel metal oxide semiconductor (PMOS) diode having its drain coupled to oscillator 202 and its source coupled to supply 204 via noise reduction circuit 206. The gate of current source 224 is coupled to noise reduction circuit 206 and subject to bias current 216 generated by bandgap reference circuit 236 and element 228. Current source 224 may have a gain that is applicable to a noise component within supply current 226.

Noise reduction circuit 206 seeks to reduce the gain of current supply 224 and reduce the bias current 216 flowing into its gate.

Noise reduction circuit 206 includes low pass filter 210 and degeneration circuit 220. Low pass filter 210 filters the noise in bias current 216. Low pass filter 210 may be any conventional low pass filter. Preferably, low pass filter 210 includes resistance 212 and capacitance 214. Resistance 212 may include a resistor. Resistance 212 may include a resistor having a value of approximately 200 kilohms. Capacitance 214 may include a capacitor. Capacitance 214 may include a capacitor having, for example, a value of 1 picofarad.

Low pass filter 210 may allow one or more frequency bands to be transmitted while rejecting signals outside of these bands. For example, in low pass filter 210, a transmitted band may extend from zero to some maximum frequency. Low pass filter 210 can be a passive filter. Low pass filter 210 may reject, or filter, noise at frequencies outside a range of interest for oscillator 202. The resistance and capacitance values of low pass filter 210 may be varied in accordance with the desired frequency range.

Thus, noise reduction circuit 206 may be configured to have low pass filter 210 between a current mirror such as element 228 and bandgap reference circuit 236, and a current source 224 coupled to an input of oscillator 202. Bias current 216 can be filtered accordingly, and the bias noise component is reduced before reaching current supply 224. This feature, in turn, may reduce the noise component of input signal 208.

Noise reduction circuit 206 also includes degeneration circuit 220. Degeneration circuit 220 is coupled to the input, or source, of current source 224. Current source 224, in turn, provides input signal 224 to VCO 202.

Current source 224 may be a varactor to tune VCO 202. A varactor diode can use a p-n junction and a reverse bias to control VCO 202. A varactor may have a structure to allow the capacitance of a diode within current source 224 to vary with a reverse voltage. A voltage controlled capacitance may be useful for tuning applications, such as tuning VCO 202.

Supply current 226 may include a noise component that is reduced by noise reduction circuit 206. Specifically, degeneration circuit 220 may reduce the noise component in supply current 226. Degeneration circuit 220 may reduce a gain from current source 224 to input signal 208. In this instance, a gain would apply to a noise component within input current 208 versus a noise component of supply current 226. Degeneration circuit 220 also may provide an output impedance to prevent noise from creeping out of oscillator 202 back to current supply 224.

As disclosed above, current source 224 may comprise a PMOS diode. Current source 224 also may be any semiconductor-type, such as an n-channel metal oxide semiconductor.

Degeneration circuit 220 includes resistance 222, and is coupled to the source of current source 224. Preferably, resistance 222 may be coupled in series with supply current 224.

For example, resistance 222 may have a value of 40 ohms. Using resistance 222, the entire resistance of degeneration circuit 220 may be increased, which in turn may directly reduce noise from supply 204. Output impedance also may be increased by a factor of resistance 222.

When a resistor is added to the source of current source 224, the effective gain of current source 224 may be reduced. Thus, degeneration circuit 220 also may reduce the gain of the noise component in supply current 226 and degeneration circuit 220. Current source 224 may act as a common source amplifier may and reduce the gain of the noise component within current source 224.

Degeneration circuit 220 can also provide an increased output impedance to the input of oscillator 202. Degeneration circuit 220 may increase the output resistance ($R_{out}$) of current source 224. An increased $R_{out}$ may reduce the coupling from supply 204 to current source 224. Reduction of coupling may be important if supply 204 is noisy. The entire resistance may be increased by a factor of the value of resistance 222 of degeneration circuit 220.

Thus, noise reduction circuit 206 is coupled between supply 204 and current supply 224 for oscillator 202. Noise reduction circuit 206 may include low pass filter 210 coupled to the gate of current supply 224, and degeneration circuit 220 coupled to the source of current supply 224. Low pass filter 210 may reduce the noise component of bias current 216 flowing into current supply 224. Degeneration circuit 220 may reduce the noise component of supply current 226 from supply 204.

Figure 3:
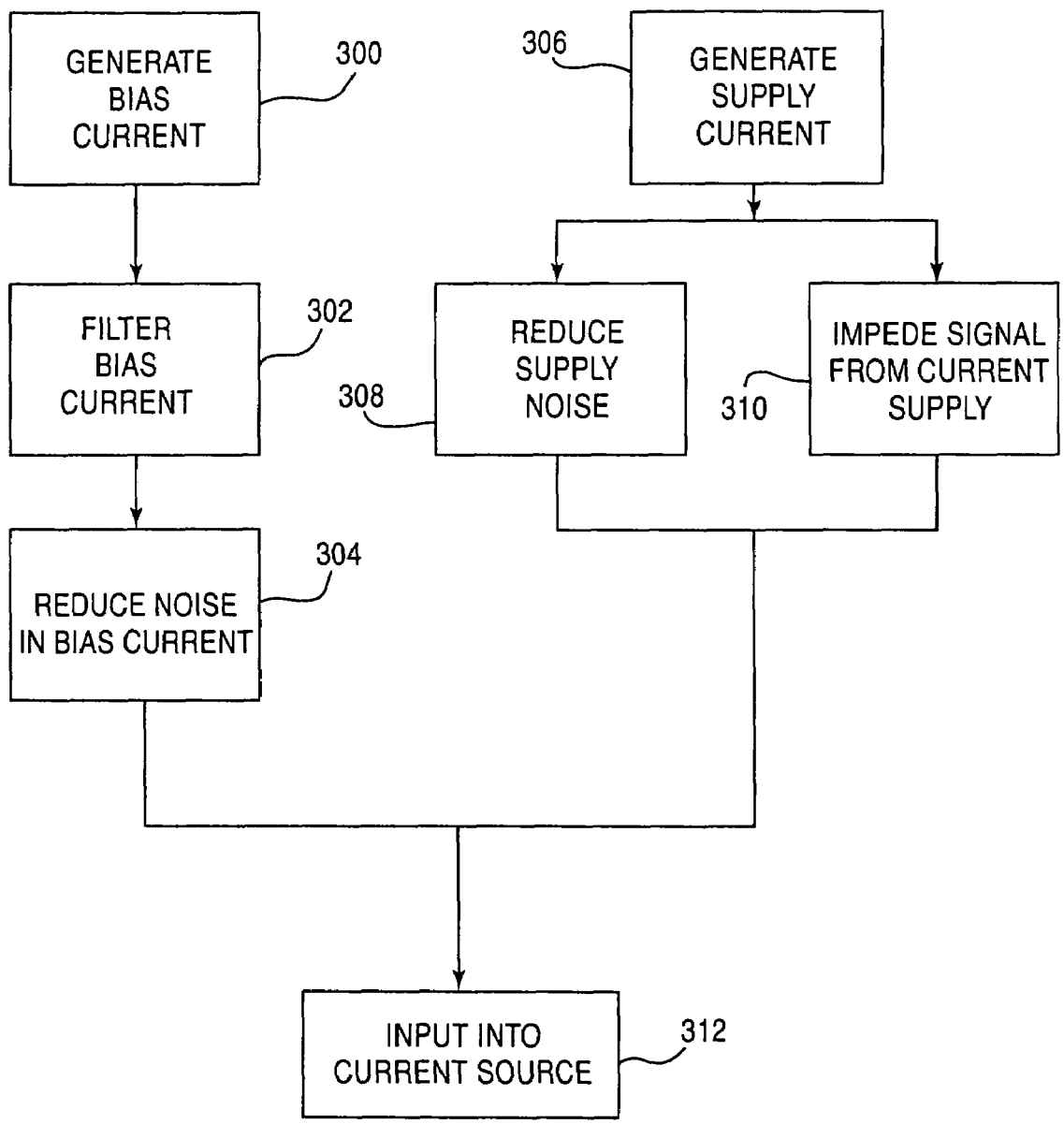
FIG. 3 illustrates a flowchart for reducing noise using a noise reduction circuit coupled to a controlled oscillator according to the disclosed embodiments.

FIG. 3 depicts a flowchart for reducing noise using a noise reduction circuit coupled to an oscillating circuit according to the preferred embodiments. For example only, reference may be made to features or elements disclosed in FIGS. 1 and 2 in disclosing the preferred embodiments.

Step 300 executes by generating a bias current, such as bias current 216. The generated bias current includes a noise component that is input to a gate of a current source for an oscillating circuit. For example, bias current 216 flows into the gate of current source 224. The bias current may be generated by a current mirror, such as band gap reference circuit 236 coupled to supply 204. Step 302 executes by filtering the bias current to remove the bias noise component using a low pass filter, such as low pass filter 210. The low pass filter includes a capacitance and a resistance that removes the noise that is not within an allowable range. Step 304 executes by reducing the noise component in the bias current by removing the noise component.

Step 306 executes by generating a supply current, such as supply current 226, from a supply coupled to the oscillating circuit. Preferably, the supply may be coupled to a current source for the oscillating circuit. For example, supply 204 is coupled to current source 224. The supply current may be supplied directly to the current supply through a degeneration circuit, such as degeneration circuit 220. Step 308 executes by reducing the supply noise component within the supply current using the degeneration circuit. The supply noise may be reduced using a resistance in the degeneration circuit. Step 310 executes by impeding noise from the supply side of the current source for the oscillating circuit. The impedance may prevent noise components from leaking out of the supply for current source. Further, the oscillating circuit may not increase the gain of a noise component from the current source to the input of the oscillating circuit.

Steps 300, 302 and 304 may be executed simultaneously with step 306, 308 and 310. Alternatively, these steps may be executed in any order. Further, the steps may be executed without the execution of the other steps. For example, steps 300, 302 and 304 may be executed and steps 306, 308 and 310 may not be executed.

Step 312 executes by inputting the supply current and the bias current into the current source. The current source, such as current source 224, then may supply an input signal to control the oscillating circuit, such as VCO 202.

One having ordinary skill in the art will readily understand that the invention as discussed above may be practiced with steps in a different order, and/or with hardware elements in configurations that are different than those disclosed. Therefore, although the invention has been disclosed based upon these preferred embodiments, it would be apparent to those of skill in the art that certain modifications, variations, and alternative constructions are apparent, while remaining within the spirit and scope of the claimed invention. In order to determine the metes and bounds of the invention, therefore, reference should be made to the appended claims and equivalents thereof.

The invention claimed is:

1. A noise reduction circuit, the noise reduction circuit comprising:
   a filter coupled to a gate of a current source for an oscillator circuit to filter a bias noise component into the gate; and
   a degeneration circuit coupled to a supply for the current source, wherein the degeneration circuit reduces a gain within the current source.

2. The circuit of claim 1, wherein the filter comprises a resistance.

3. The circuit of claim 1, wherein the filter comprises a capacitance.

4. The circuit of claim 1, wherein the current source comprises a diode.

5. The circuit of claim 1, wherein the current source comprises a p-channel metal oxide semiconductor.

6. The circuit of claim 1, wherein the degeneration circuit comprises a resistance.

7. The circuit of claim 1, wherein the filter comprises a low pass filter.

8. The circuit of claim 7, wherein the filter is coupled to a current mirror circuit to generate a bias current comprising the bias noise component.

9. The circuit of claim 7, wherein the degeneration circuit reduces a supply noise component.

10. The circuit of claim 1, further comprising:
    a bias current source for supplying bias current to the gate of the current source; and
    a bandgap reference coupled to a gate of the bias current source.

11. The circuit of claim 10, wherein the bandgap reference is directly coupled to the gate of the bias current source.

12. The circuit of claim 1, further comprising:
    a bias current source for supplying bias current to the gate of the current source, wherein the bias current source comprises a diode.

13. The circuit of claim 1, wherein the current source comprises a predetermined capacitance.

14. The circuit of claim 13, wherein the predetermined capacitance is a function of voltage.

15. A system for reducing noise in an oscillator circuit, the system comprising:
    a filtering device having a first resistance and a capacitance to filter a bias current and coupled to a gate of a current source; and
    a degeneration device having a second resistance to reduce a noise component in a supply current at the current source.

16. The system of claim 15, further comprising a band gap reference circuit to generate the bias current.

17. The system of claim 15, further comprising a power supply to generate the supply current.

18. The system of claim 15, wherein the second resistance comprises a resistor.

19. The system of claim 15, wherein the filtering device comprises a low pass filter.

20. The system of claim 19, wherein the low pass filter comprises a resistor.

21. The system of claim 19, wherein the low pass filter comprises a capacitor.

22. The system of claim 15, wherein the current source comprises diode.

23. The system of claim 22, wherein the first semiconductor type comprises a p-channel metal oxide semiconductor.

24. A method for reducing noise, the method comprising:
    filtering a bias noise component from a bias current flowing into a gate of a current source for an oscillator circuit; and
    reducing a supply noise component from a supply current flowing into a supply of the current source.

25. The method of claim 24, wherein the filtering step comprises filtering the bias current using a low pass filter.

26. The method of claim 24, wherein the reducing step comprises reducing the supply noise component using a degeneration circuit.

27. The method of claim 24, further comprising reducing a gain of the current source.

28. The method claim 24, further comprising impeding a signal from the supply of the current source using a degeneration circuit.

29. A method for reducing noise components, the method comprising:
    reducing a bias noise component by passing a bias current through a noise reduction circuit coupled to a gate of a current source to an oscillator circuit; and
    reducing a supply noise component by passing a supply current through the noise reduction circuit coupled to a supply of the current source.

30. The method of claim 29, further comprising generating an input current by the current source to control the oscillator circuit.

31. The method of claim 29, wherein the first reducing step comprises reducing the bias noise component by filtering the bias current with a filter within the noise reduction circuit.

32. The method of claim 29, wherein the second reducing step comprises reducing the supply noise component by passing the supply current through a degeneration circuit within the noise reduction circuit.

33. A circuit comprising:
    an oscillator circuit to generate an output signal;
    a current source to control the oscillator circuit, wherein the current source receives a signal derived from a reference signal to generate the output signal; and
    a noise reduction circuit coupled to a gate and a supply of the current source to reduce a noise component within the signal.

34. The circuit of claim 33, wherein the noise reduction circuit comprises a filter coupled to the gate.

35. The circuit of claim 33, wherein the noise reduction circuit comprises a degeneration circuit coupled to the supply.

36. A circuit for reducing noise, the circuit comprising:
    filtering means for filtering a bias noise component from a bias current flowing into a gate of a current source for an oscillator circuit; and
    reducing means for reducing a supply noise component from a supply current flowing into a supply of the current source.

37. A circuit for reducing noise components, the circuit comprising:
   first reducing means for reducing a bias noise component by passing a bias current through a noise reduction circuit coupled to a gate of a current source to an oscillator circuit; and
   second reducing means for reducing a supply noise component by passing a supply current through the noise reduction circuit coupled to a supply of the current source.

38. An oscillator circuit current source, comprising:
   a filter, configured to filter a substantial amount of noise in a bias current, coupled to a gate of a current source for an oscillator circuit; and
   a degeneration circuit coupled to a supply for the current source, wherein the degeneration circuit reduces a gain within the current source.

* * * * *